United States Patent
Hayashi

(10) Patent No.: US 9,702,285 B2
(45) Date of Patent: Jul. 11, 2017

(54) EXHAUST SYSTEM

(71) Applicant: TOKYO ELECTRON LIMITED, Tokyo (JP)

(72) Inventor: Kiyoto Hayashi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 153 days.

(21) Appl. No.: 14/682,274

(22) Filed: Apr. 9, 2015

(65) Prior Publication Data

US 2015/0300227 A1    Oct. 22, 2015

(30) Foreign Application Priority Data

Apr. 21, 2014 (JP) ................... 2014-087096
Feb. 25, 2015 (JP) ................... 2015-035795

(51) Int. Cl.

| | |
|---|---|
| *B01D 45/00* | (2006.01) |
| *F01N 3/08* | (2006.01) |
| *H01J 37/32* | (2006.01) |
| *B01D 45/08* | (2006.01) |
| *H01L 21/67* | (2006.01) |
| *C23C 16/44* | (2006.01) |

(52) U.S. Cl.
CPC .............. *F01N 3/08* (2013.01); *B01D 45/08* (2013.01); *H01J 37/32834* (2013.01); *H01J 37/32844* (2013.01); *C23C 16/4412* (2013.01); *H01L 21/67109* (2013.01); *Y02C 20/30* (2013.01); *Y02P 70/605* (2015.11)

(58) Field of Classification Search
CPC .............. H01L 21/67109; B01D 45/08; C23C 16/4412; Y02P 70/605; Y02C 20/30
See application file for complete search history.

(56) References Cited

U.S. PATENT DOCUMENTS

| | | | | |
|---|---|---|---|---|
| 5,819,683 | A * | 10/1998 | Ikeda ..................... | B01D 53/34 118/715 |
| 6,332,925 | B1* | 12/2001 | Noji ..................... | B01D 53/002 118/715 |
| 6,966,936 | B2* | 11/2005 | Yamasaki ............... | C23C 16/18 118/715 |

(Continued)

FOREIGN PATENT DOCUMENTS

JP    2013-062362 A    4/2013

*Primary Examiner* — Dung H Bui
(74) *Attorney, Agent, or Firm* — Nath, Goldberg & Meyer; Jerald L. Meyer

(57) ABSTRACT

An exhaust system connected to an exhaust port of a substrate processing apparatus includes: a first exhaust trap having an exhaust input at an upper portion thereof and an exhaust output at a lower portion thereof and cooling a product produced in the substrate processing apparatus; a second exhaust trap installed at a downstream side of an exhaust flow with respect to the first exhaust trap, having an exhaust input at a lower portion thereof and an exhaust output at an upper portion thereof, and cooling the product; a storage unit installed between the first and second exhaust traps and storing the product cooled by the first and second exhaust traps; a first pipe connecting the exhaust port of the substrate processing apparatus and the first exhaust trap; and a second pipe connecting the first exhaust trap, the second exhaust trap and the storage unit.

7 Claims, 7 Drawing Sheets

(56) References Cited

U.S. PATENT DOCUMENTS

| | | | | |
|---|---|---|---|---|
| 7,727,296 B2* | 6/2010 | Tojo | ................ | B01D 45/06 |
| | | | | 118/715 |
| 8,915,775 B2* | 12/2014 | Ikeda | ................ | C23C 16/4412 |
| | | | | 454/49 |
| 9,057,388 B2* | 6/2015 | Comeau | ................ | F04F 9/00 |
| 2007/0175188 A1* | 8/2007 | Tsuji | ................ | B01D 45/08 |
| | | | | 55/444 |
| 2013/0061969 A1* | 3/2013 | Koike | ................ | H01L 21/67017 |
| | | | | 138/37 |

* cited by examiner

EXHAUST SYSTEM

CROSS-REFERENCE TO RELATED APPLICATIONS

This application claims the benefit of Japanese Patent Application No. 2014-087096, filed on Apr. 21, 2014 and Japanese Patent Application No. 2015-035795, filed on Feb. 25, 2015, in the Japan Patent Office, the disclosure of which is incorporated herein in their entirety by reference.

TECHNICAL FIELD

The present disclosure relates to an exhaust system.

BACKGROUND

In manufacturing of a semiconductor device, various processes such as a film forming process, a heating process and an etching process are performed on an object to be processed (e.g., a semiconductor wafer) within a processing vessel. A product, such as an unreacted reaction product or a reaction by-product, according to a variety of processes, is contained in an exhaust gas discharged from the processing vessel in such a process. When the product is deposited on an inner wall of an exhaust pipe or a vacuum pump, in some cases, a decrease in exhaust performance or a trouble of the vacuum pump may occur. Therefore, conventionally, an exhaust trap for trapping the product has been known.

However, the conventional exhaust trap had a short PM (Preventive Maintenance) cycle indicative of a period during which preventive maintenance is performed.

SUMMARY

Some embodiments of the present disclosure provide to an exhaust system having a long PM cycle.

According to one embodiment of the present disclosure, an exhaust system connected to an exhaust port of a substrate processing apparatus includes: a first exhaust trap having an exhaust input at an upper portion of the first exhaust trap and an exhaust output at a lower portion of the first exhaust trap and configured to cool a product produced in the substrate processing apparatus; a second exhaust trap installed at a downstream side of an exhaust flow with respect to the first exhaust trap and having an exhaust input at a lower portion of the second exhaust trap and an exhaust output at an upper portion of the second exhaust trap, the second exhaust trap being configured to cool the product produced in the substrate processing apparatus; a storage unit installed between the first exhaust trap and the second exhaust trap and storing the product cooled by the first exhaust trap and the second exhaust trap; a first pipe connecting the exhaust port of the substrate processing apparatus and the first exhaust trap; and a second pipe connecting the first exhaust trap, the second exhaust trap and the storage unit.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Hereinafter, an exhaust system according to an embodiment and a substrate processing apparatus having the exhaust system applied thereto will be described with reference to the accompanying drawings. The exhaust system according to the embodiment is applicable to various substrate processing apparatuses. For convenience of understanding, an example in which the exhaust system is applied to a vertical heat treatment apparatus as one of the substrate processing apparatuses will be described. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

(Substrate Processing Apparatus)

Figure 1:
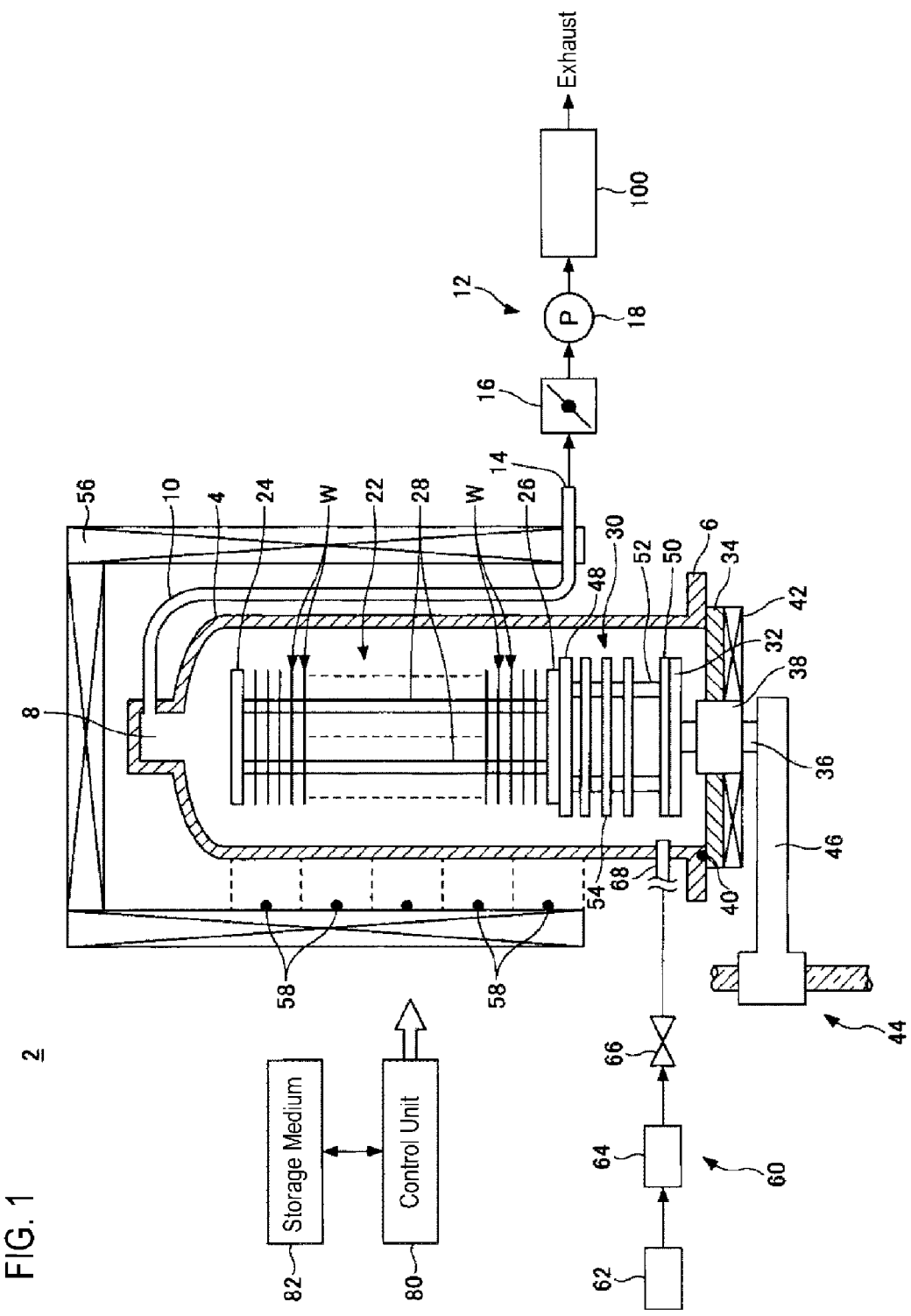
FIG. 1 is a schematic configuration view showing an example of a substrate processing apparatus according to an embodiment of the present disclosure.

First, the configuration of a substrate processing apparatus to which an exhaust system according to an embodiment of the present disclosure may be applied will be described. FIG. 1 is a schematic configuration view showing an example of a substrate processing apparatus according to the embodiment of the present disclosure.

As shown in FIG. 1, the substrate processing apparatus 2 has a processing vessel 4 capable of accommodating a plurality of semiconductor wafers (hereinafter, referred to as wafers W) as objects to be processed. The processing vessel 4 has a circular cylindrical shape having a ceiling, and is made of, for example, a material having high heat resistance, such as quartz.

The processing vessel 4 has an open lower end, and a flange portion 6 is formed at the open lower end. An upwardly protruding exhaust chamber 8 is formed at the ceiling of the processing vessel 4. An exhaust pipe 10 made of, for example, a material such as quartz, extends from the exhaust chamber 8. The exhaust pipe 10 extends downward along the outer wall of the processing vessel 4 and bends in the horizontal direction at a lower portion of the processing vessel 4. Then, an exhaust device 12 is connected to the exhaust pipe 10 through an exhaust port 14, thereby being capable of exhausting an atmosphere of the processing vessel 4.

The exhaust device 12 has an exhaust flow channel made of, for example, stainless steel, which is connected to a leading end of the exhaust pipe 10. A pressure adjustment valve 16, an exhaust pump 18, and an exhaust system 100 according to the embodiment of the present disclosure, which will be described later, are installed in this order on the exhaust flow channel toward a downstream side from an upstream side of the exhaust flow channel.

The pressure adjustment valve 16 is configured to adjust a pressure within the processing vessel 4. The exhaust pump 18 may be, for example, an ejector. In a case where a processing pressure is close to a normal pressure, the exhaust pump 18 may be omitted. The exhaust system 100, which will be described in detail later, is configured to remove harmful substances and the like contained in an exhaust gas.

A wafer boat 22 configured to hold a plurality of wafers W is vertically inserted (loaded) into and separated (unloaded) from the open lower end of the processing vessel 4.

The wafer boat 22 has a ceiling plate 24, a bottom plate 26, and a plurality of, for example, four, posts 28 (only two posts are shown in FIG. 1) extending between the ceiling plate 24 and the bottom plate 26. The wafer boat 22 is made of, for example, a material such as quartz.

Support grooves (not shown) are formed at a predetermined pitch in each post 28 of the wafer boat 22. Peripheral portions of the wafers W are supported in the support grooves, so that the plurality of wafers W can be held in a multi-stage manner. The wafer boat 22 is configured so that the wafers W are loaded and unloaded through one side of the wafer boat 22 in the lateral direction. The wafer boat 22 may be configured to hold, for example, about 50 to 200 wafer sheets having a diameter of 300 mm or 450 mm as an example.

The wafer boat 22 is mounted on a table 32 so as to place a thermal insulation unit 30 made of, for example, a material such as quartz between the wafer boat 22 and the table 32. The table 32 is installed on an upper end of a rotating shaft 36 penetrating through a lid 34 which opens and closes the open lower end of the processing vessel 4. For example, a magnetic fluid seal 38 is located between the rotating shaft 36 and the portion of the lid 34 penetrated by the rotating shaft 36. The magnetic fluid seal 38 air-tightly seals and rotatably supports the rotating shaft 36. In addition, a seal member 40 configured as an O-ring or the like is located between a peripheral portion of the lid 34 and the flange portion 6 of the processing vessel 4, so that the sealability of the processing vessel 4 is maintained. The lid 34 is provided with a lid heating unit 42 for heating the lid 34.

The rotating shaft 36 is installed at a leading end of an arm 46 supported by, for example, an elevating mechanism 44 such as a boat elevator, to move up and down the wafer boat 22, the lid 34 and the like together.

The thermal insulation unit 30 has a circular ring-shaped ceiling plate 48, a circular disc-shaped bottom portion 50, a plurality of, for example, four, posts 52 (only two posts are shown in FIG. 1) extending between the ceiling plate 48 and bottom portion 50. A plurality of circular ring-shaped fins 54 are installed in the middle of the posts 52 at a predetermined pitch.

The thermal insulation unit 30 serves to prevent an excessive temperature drop at a bottom region of the wafer boat 22 by accumulating the heat generated from a heating unit 56, which will be described later. In addition, although the thermal insulation unit 30 and the wafer boat 22 are formed as separate bodies in the example shown in FIG. 1, they may be formed into a single body made of a material such as quartz. Alternatively, a circular cylindrical molded body made of a material such as quartz may be used as the thermal insulation unit 30.

The circular cylindrical heating unit 56, for example, having a carbon wire heater, is installed in an outer periphery and the ceiling of the processing vessel 4 to surround the processing vessel 4. The heating unit 56 is divided into a plurality of, for example, five, heating zones corresponding to accommodating regions of wafers W as shown in FIG. 1. A thermocouple 58 is installed as a temperature measuring unit in each heating zone, which makes it possible to perform a temperature control for each heating zone through a feedback control.

A gas supply system 60 for supplying a processing gas necessary for various substrate processes is installed and connected to a lower end portion of the processing vessel 4. The gas supply system 60 has a reaction gas supply source 62, a flow rate controller 64 such as a mass flow controller, and an opening/closing valve 66 in this order from an upstream side to a downstream side of the gas supply system 60. In addition, a gas nozzle 68 for introducing the processing gas into the processing vessel 4, which is disposed at the most downstream side of the gas supply system 60, is installed in a sidewall of the processing vessel 4.

Although one kind of processing gas is introduced into the processing vessel 4 in the example shown in FIG. 1, the present disclosure is not limited thereto, and a plurality of kinds of processing gases may be introduced into the processing vessel 4. In addition, another gas such as a purge gas or an inert gas may be introduced into the processing vessel 4.

A control unit 80, for example, consisting of a microcomputer or the like, is provided in the substrate processing apparatus 2 in order to control an overall operation of the substrate processing apparatus 2 together with the supply amount of gas, a processing temperature, a processing pressure or the like. The control unit 80 has a storage medium 82 for storing programs which are used in controlling the operation of the substrate processing apparatus 2.

The storage medium 82 may include, for example, a flexible disc, a compact disc (CD), a hard disc, a flash memory, a DVD or the like. In addition, a variety of instructions, programs and the like may be input into the control unit 80 through a user interface (not shown).

(Exhaust System)

Next, the exhaust system 100 which is applied to the substrate processing apparatus 2 according to the embodiment of the present disclosure will be described with reference to the accompanying drawings.

Figure 2:
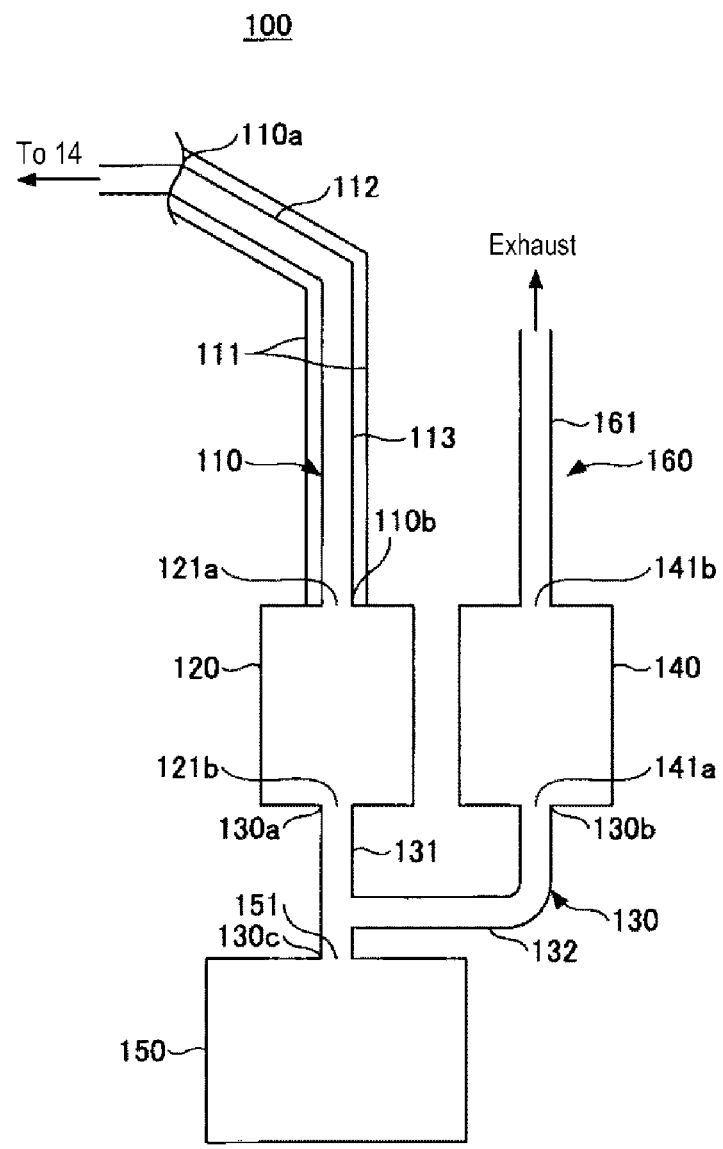
FIG. 2 is a schematic configuration view showing an example of an exhaust system according to the embodiment of the present disclosure.

FIG. 2 is a schematic configuration view showing an example of the exhaust system according to the embodiment of the present disclosure. Respective components are generally connected to one another through flange connection using flange portions formed at ends of the respective components, but may be connected through another connecting method such as a twisting connection or a welding connection. FIG. 2 schematically shows connection between the respective components.

The exhaust system 100 according to the embodiment of the present disclosure is connected and installed to the exhaust port 14 of a substrate processing apparatus 2. The exhaust system 100 includes: a first exhaust trap 120 having an exhaust input 121a at an upper portion of the first exhaust trap 120 and an exhaust output 121b at a lower portion of the first exhaust trap 120 and configured to cool a product produced in the substrate processing apparatus 2; a second exhaust trap 140 installed at a downstream side of an exhaust flow with respect to the first exhaust trap 120 and having an exhaust input 141a at a lower portion of the second exhaust trap 140 and an exhaust output 141b at an upper portion of the second exhaust trap 140, the second exhaust trap 140 being configured to cool the product produced in the substrate processing apparatus 2; a storage unit 150 installed between the first exhaust trap 120 and the second exhaust trap 140, having an opening 151 at an upper portion of the storage unit 150, and storing the product cooled by the first exhaust trap 120 and the second exhaust trap 140; a first pipe 110 connecting the exhaust port 14 and the first exhaust trap 120; and a second pipe 130 connecting the first exhaust trap 120, the second exhaust trap 140 and the storage unit 150.

Next, the respective components of the exhaust system 100 will be described from the upstream side of the exhaust flow in order.

The first pipe 110 is a pipe, which is connected to the exhaust port 14 of the substrate processing apparatus 2 to guide the product produced in the substrate processing apparatus 2 to the first exhaust trap 120. In some embodiment, a heating unit 111 may be provided around an outer periphery of the first pipe 110 in order to prevent the product produced in the substrate processing apparatus from being cooled in the first pipe 110 and attached to an inner wall of the first pipe 110. In some embodiment, the heating unit 111 may include, but is not limited to, a panel heater or the like.

In some embodiment, the first pipe 110 may extend downward to a second end portion 110b connected to the first exhaust trap 120 from a first end portion 110a connected to the exhaust port 14. Accordingly, the product produced in the substrate processing apparatus 2 is guided to the first exhaust trap 120 by the gravity of the product even when the product is cooled within the first pipe 110 to be liquefied and/or solidified. More specifically, the first pipe 110 may have an inclined portion 112 connected to the exhaust port 14 at the first end portion 110a and extending to be downwardly inclined from the first end portion 110a, and a vertical portion 113 connected to the inclined portion 112 and extending vertically downward to the second end portion 110b.

Figure 3:
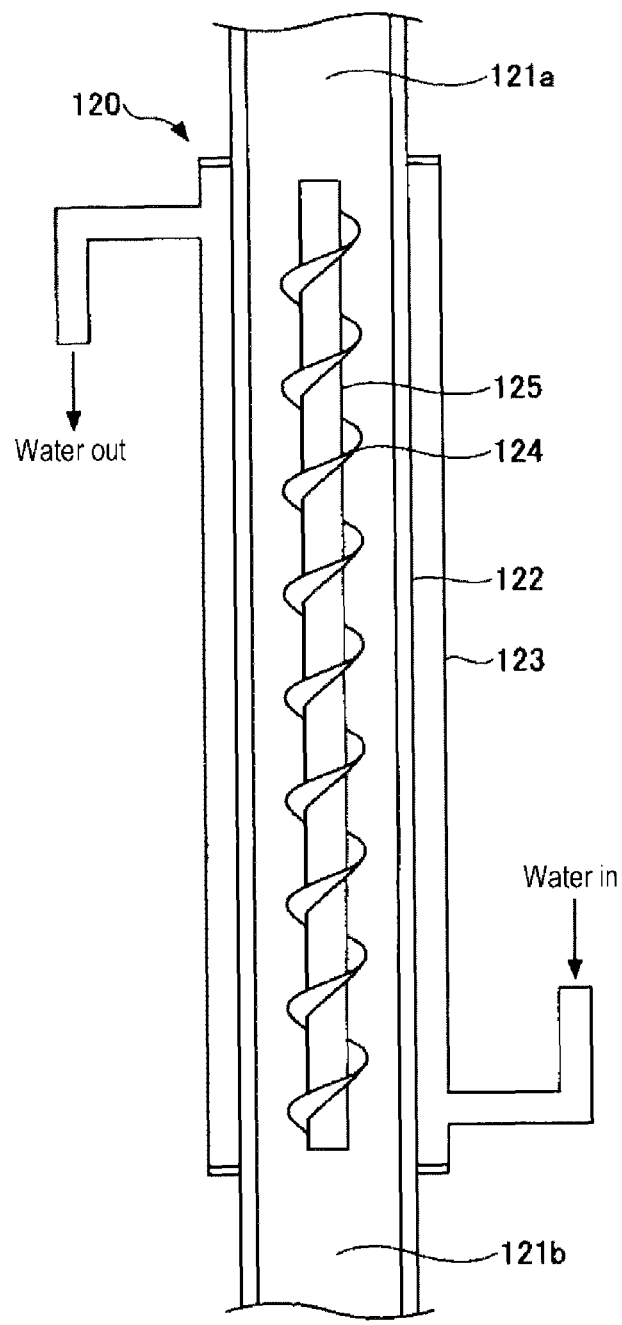
FIG. 3 is a schematic configuration view showing an example of a first exhaust trap according to the embodiment of the present disclosure.

FIG. 3 is a schematic configuration view showing an example of the first exhaust trap 120 according to the embodiment of the present disclosure.

As shown in FIG. 3, the first exhaust trap 120 has the exhaust input 121a installed at the upper portion of the first exhaust trap 120 and the exhaust output 121b installed at the lower portion of the first exhaust trap 120. As shown in FIG. 2 and described above, the exhaust input 121a is connected to the second end portion 110b of the first pipe 110, and the exhaust output 121b is connected to a third end portion 130a of the second pipe 130.

In some embodiment, the first exhaust trap 120 may be provided with a water-cooling jacket 123 to cover an outer periphery of a cylindrical member 122 of a main body. In this case, as water circulates within the water-cooling jacket 123, an exhaust gas introduced into the first exhaust trap 120 is cooled. However, the first exhaust trap 120 may be configured as an air-cooling type exhaust trap. In this case, the water-cooling jacket 123 may not be installed.

In some embodiment, a bar-shaped member 125 having a fin 124, which is formed in a spiral shape on an outer peripheral surface of the bar-shaped member 125 along the length direction of the bar-shaped member 125, may be installed within the first exhaust trap 120 in order to expand a cooling area and improve cooling efficiency. As the bar-shaped member 125 having the spiral fin 124 is disposed, the exhaust gas introduced into the first exhaust trap 120 from the exhaust input 121a is guided to a water-cooling surface or an air-cooling surface that is the outer peripheral surface of the cylindrical member 122 by the fin 124. Accordingly, it is possible to cool the exhaust gas more efficiently.

Figure 4:
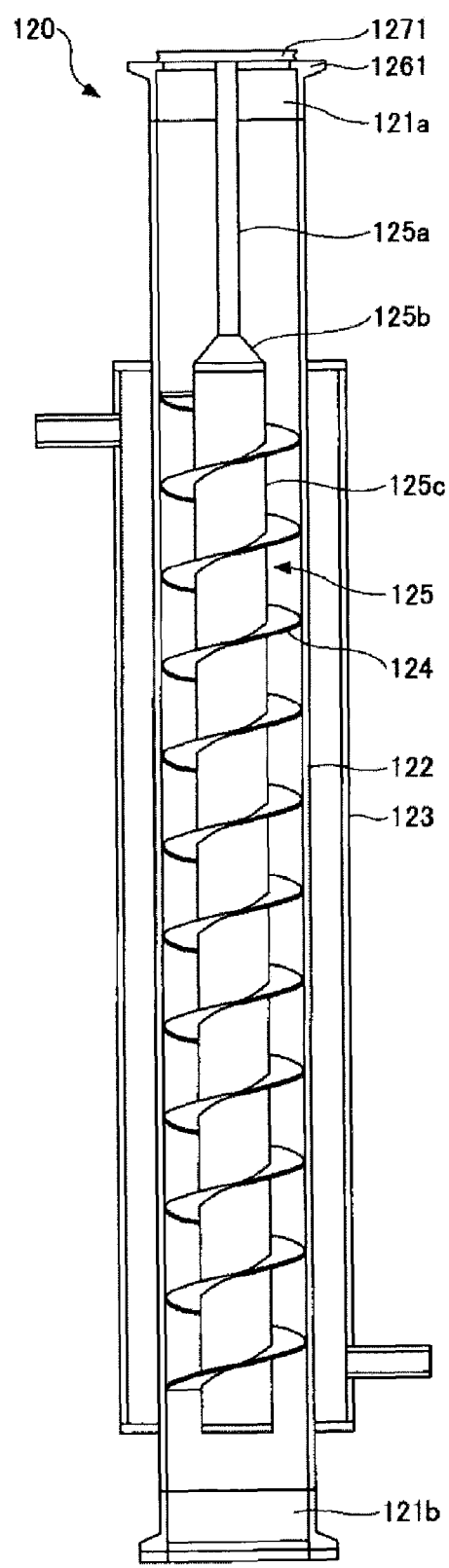
FIG. 4 is an internal configuration view showing the entire configuration of the first exhaust trap in detail.
Figure 5:
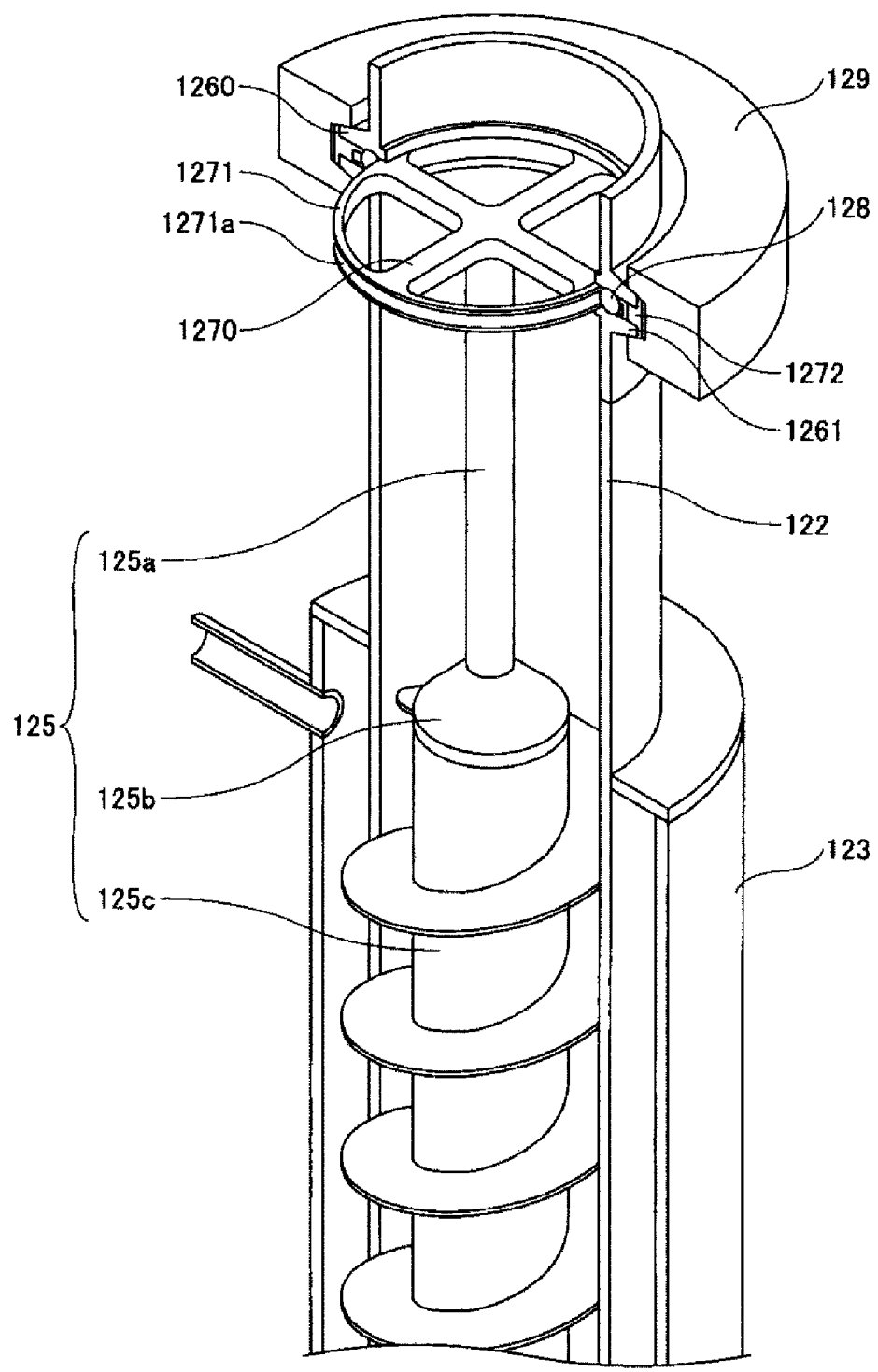
FIG. 5 is an internal structural view showing a connection structure between an upper portion of the first exhaust trap and a first pipe in detail.

Next, the configuration of the first exhaust trap 120 will be described in detail with reference to FIGS. 4 and 5. FIG. 4 is an internal configuration view showing the entire configuration of the first exhaust trap 120 in detail. FIG. 5 is an internal structural view showing a connection structure between an upper portion of the first exhaust trap 120 and the first pipe 110 in detail.

As shown in FIG. 4, the bar-shaped member 125 of the first exhaust trap 120, more specifically, has a small diameter portion 125a, a diameter expanding portion 125b and a large diameter portion 125c. An upper end flange 1261 is provided at an upper end of the cylindrical member 122. An inner ring 1271 is installed on the upper end flange 1261.

As shown in FIG. 5, the small diameter portion 125a of the bar-shaped member 125 is connected to a cross-shaped supporting member 1270, while the inner ring 1271 is installed at outer ends of a cross-shaped portion of the supporting member 1270. A groove 1271a is formed at an outer periphery of the inner ring 1271 along a circumferential direction of the inner ring 1271. In addition, an annular outer ring 1272 is provided at the outside of the inner ring 1271. An O-ring 128 is installed between the groove 1271a at the outer periphery of the inner ring 1271 and an inner peripheral surface of the outer ring 1272. A flange 1260 is provided at a position vertically symmetric to the upper end flange 1261 with respect to the O-ring 128, while the inner ring 1271, the O-ring 128 and the outer ring 1272 are vertically located between the flange 1260 and the upper end flange 1261. The flange 1260, the upper end flange 1261 and the outer ring 1272 are clamped by a clamping member 129 from the outside of them. In addition, the flange 1260 is a lower end portion of the first pipe 110 (see FIG. 2), and the first pipe 110 and the first exhaust trap 120 are connected to each other through the flange 1260 and the upper end flange 1261.

In this way, it is possible to easily connect the first exhaust trap 120 and the first pipe 110 with a simple assembling structure while maintaining air-tightness using the supporting member 1270, the inner ring 1271, the outer ring 1272, the O-ring 128, the flange 1260, the upper end flange 1261 and the clamping member 129.

The first exhaust trap 120 according to the embodiment of the present disclosure can effectively guide the exhaust gas toward the outer periphery by means of the fin 124 installed at the large diameter portion 125c of the bar-shaped member 125, thereby efficiently cooling the exhaust gas in the water-cooling jacket 123. In addition, the first exhaust trap 120 can be easily connected to the first pipe 110 using the above-described connection structure. Further, in this connection structure, if the clamping member 129 is removed, the first exhaust trap 120 can be removed from the first pipe 110, thereby also easily performing the maintenance.

In addition, such a connection structure of the first exhaust trap 120 can be applied not only to the upper side of the first exhaust trap 120 but also to the lower side of the first exhaust trap 120, and also be applied to the second exhaust trap 140 in the same manner. By employing such a connection structure, it is possible to efficiently trap the exhaust gas and to easily perform the installation and the maintenance.

Referring back to FIG. 2, the second pipe 130 is a pipe which connects the first exhaust trap 120, the second exhaust trap 140 and the storage unit 150. The second pipe 130 is connected to the first exhaust trap 120 at the third end portion 130a, connected to the second exhaust trap 140 at a fourth end portion 130b, and connected to the storage unit 150 at a fifth end portion 130c.

As described above, the storage unit 150 has an opening 151 at an upper portion of the storage unit 150, while the product cooled in the first exhaust trap 120 and the second exhaust trap 140 is guided into and stored in the storage unit 150 through the opening 151. To this end, in some embodiment, the second pipe 130 may extend downward from the third end portion 130a connected to the first exhaust trap 120 to the fifth end portion 130c connected to the storage unit 150 and extends downward from the fourth end portion 130b connected to the second exhaust trap 140 to the fifth end portion 130c connected to the storage unit 150. In another embodiment, the second pipe 130 may have a vertical portion 131 extending vertically downward from the third end portion 130a connected to the first exhaust trap 120 to the fifth end portion 130c connected to the storage unit 150, and a branch portion 132 branching off from the vertical portion 131 to extend upward to the fourth end portion 130b. Accordingly, the product cooled in the first exhaust trap 120 and the second exhaust trap 140 is guided downward to the storage unit 150 by the gravity of the product.

The second exhaust trap 140 is provided in order to trap a product that was not able to be collected in the first exhaust trap 120 and is installed at the downstream side of the exhaust flow with respect to the first exhaust trap 120.

Contrary to the first exhaust trap 120, the second exhaust trap 140 has the exhaust input 141a at the lower portion of the second exhaust trap 140 and the exhaust output 141b at the upper portion of the second exhaust trap 140 in order to guide the product trapped in the second exhaust trap 140 to the storage unit 150. With this configuration, the product cooled in the second exhaust trap 140 is guided, by the gravity of the product, to the storage unit 150 via the exhaust input 141a and the second pipe 130.

The second exhaust trap 140 may have the same structure as the first exhaust trap 120, except that the second exhaust trap 140 has the exhaust input 141a at the lower portion of the second exhaust trap 140 and the exhaust output 141b at the upper portion of the second exhaust trap 140.

Using the exhaust system 100 according to the embodiment of the present disclosure, the product in the exhaust gas discharged through the exhaust port 14 of the substrate processing apparatus 2 is discharged from the exhaust output 141b at the upper portion of the second exhaust trap 140 via the first pipe 110, the first exhaust trap 120, the second pipe 130 and the second exhaust trap 140. The product trapped in the first exhaust trap 120 and the second exhaust trap 140 is guided to the storage unit 150 from the opening 151 via the second pipe 130.

In addition, the second exhaust trap 140, as shown in FIG. 2, may be connected to a third pipe 160 having a vertical portion 161 connected to the exhaust output 141b at the upper portion of the second exhaust trap 140 and extending at least upward. As the third pipe 160 having the vertical portion 161 is disposed, the product produced in the substrate processing apparatus 2 can be cooled and trapped in the vertical portion 161 even when the product was not trapped in the first exhaust trap 120 and the second exhaust trap 140. Then, the product cooled in the vertical portion 161 is guided to the storage unit 150 via the vertical portion 161, the second exhaust trap 140 and the second pipe 130. As a result, as the third pipe 160 is disposed, it is possible to further reduce the probability that a product will remain in the exhaust gas.

As described above, the exhaust system 100 according to the embodiment of the present disclosure includes: the first exhaust trap 120 having the exhaust input 121a at the upper portion of the first exhaust trap 120 and the exhaust output 121b at the lower portion of the first exhaust trap 120; the second exhaust trap 140 installed at the downstream side of the exhaust flow with respect to the first exhaust trap 120 and having the exhaust input 141a at the lower portion of the second exhaust trap 140 and the exhaust output 141b at the upper portion of the second exhaust trap 140; and the storage unit 150 installed between the first exhaust trap 120 and the second exhaust trap 140, having the opening 151 at the upper portion of the storage unit 150, and storing the product. Hence, it is possible to surely trap the product and also to surely guide the product to the storage unit 150. With this configuration, the exhaust system 100 according to the embodiment of the present disclosure is an exhaust system having a long PM cycle.

The exhaust system 100 according to the embodiment of the present disclosure can be applied to various heat treatments including film formation. Recently, the exhaust system 100 has been used even in an apparatus for sintering a photoresist used in a photolithography technique.

That is, in the photolithography technique, a photoresist is applied to a semiconductor wafer such as a silicon substrate. After sintering the photoresist, the photoresist is exposed by irradiating it with ultraviolet light or the like through a photomask, thereby transferring a mask pattern to the photoresist. Subsequently, the photoresist is developed, thereby forming a resist pattern.

The photoresist is composed of, for example, a mixed liquid of a photosensitizer, a resin, a solvent and the like. After the photoresist is applied to a semiconductor wafer, a pre-bake or a post-bake is performed on the semiconductor wafer to which the photoresist applied, so that moisture or volatile components in the photoresist are evaporated. Accordingly, a thin film of the photoresist is sintered as described above.

Particularly, a vertical heat treatment apparatus capable of sintering a plurality of semiconductor wafers at a time may be used as a heat treatment apparatus for performing a sintering process as the post-bake.

Therefore, hereinafter, an example of the sintering process of the photoresist using the substrate processing apparatus 2 including the exhaust system 100 according to the embodiment of the present disclosure will be described below.

In the substrate processing apparatus 2, a plurality of pre-baked wafers W to which a photoresist applied are heated by the heating unit 56 while a large amount of an inert gas such as a $N_2$ gas is supplied into the processing vessel 4 in a state in which the plurality of wafers W are supported in a multi-stage manner. Then, moisture or volatile components generated from the photoresist by the heating are discharged together with the $N_2$ gas, whereby the photoresist is sintered. In this case, the $N_2$ gas is introduced, for example, into a lower portion of the processing vessel 4, flowed upward from the bottom in the processing vessel 4, and discharged together with the volatile components, thereby being guided to the exhaust system 100.

Specifically, first, unprocessed wafers W are supported in the wafer boat 22 in a multi-stage manner. In this state, the wafer boat 22 is loaded from below into the processing vessel 4, which is preheated to, for example, 100 degrees C., in advance. Then, the wafer boat 22 is air-tightly accommodated in the processing vessel 4. The semiconductor wafers W have a diameter of, for example, 300 mm Here, 50 to 150 wafer sheets are accommodated. The photoresist has been applied to surfaces of the semiconductor wafers W, and the pre-bake process or the like, for example, is performed with respect to the surfaces of the semiconductor wafers W in a pre-processing process.

During the heat treatment, an atmosphere within the processing vessel 4 is connected to an exhaust equipment of a factory through the exhaust system 100 according to the embodiment of the present disclosure, and thus, always discharged to the outside. As the wafer boat 22 rotates, the wafers W are rotated at a predetermined rotating speed during the heat treatment. Then, the $N_2$ gas as an inert gas is introduced into the processing vessel 4 from the gas nozzle 68 at the lower portion of the processing vessel 4 by the gas supply system 60, and simultaneously, temperatures of the processing vessel 4 and the wafers W rise by increasing an electric power to be supplied to the heating unit 60. Thereafter, a processing temperature is maintained at about 150 to 250 degrees C., for example. The photoresist on the surfaces of the wafers W is sintered at the processing temperature. That is, moisture, solvent or the like contained in the photoresist is evaporated and the photoresist becomes solidified. At this time, the processing pressure ranges from normal pressure to about 500 Torr.

When the $N_2$ gas introduced from the gas nozzle 68 at the lower portion of the processing vessel 4 flows out upward from below within the processing vessel 4, the generated moisture, solvent or the like is carried out together with the $N_2$ gas. Then, the $N_2$ gas including the moisture, the solvent or the like reaches the ceiling of the processing vessel 4 and is discharged to the outside of the processing vessel 4 from the exhaust chamber 8. Also, the $N_2$ gas flows out through the exhaust pipe 10 and the exhaust flow channel of the exhaust device 12 and is guided to the exhaust system 100. According to the above-described configuration and function of the exhaust system 100, it is possible to efficiently cool the exhaust gas.

The mixed liquid of the photosensitizer, resin, solvent and the like, which constitutes the photoresist, includes components generally solidified at not more than 200 degrees C. and is deposited as a liquefied product when the exhaust gas is cooled. The exhaust system 100 according to the embodiment of the present disclosure has the spiral fin 124 having a downwardly inclined surface. Thus, the liquefied product flows downward along an upper surface of the spiral fin 124 to be trapped in the storage unit 150. As described above, the exhaust system 100 according to the embodiment of the present disclosure can be appropriately applied to the sintering process of the photoresist used in the photolithography technique.

(First Example)

A first example, which confirms that a product in an exhaust gas can be surely trapped by using the exhaust system 100 according to the embodiment of the present disclosure, will be described.

Thermocouples were disposed at a plurality of predetermined positions in the exhaust system 100 according to the embodiment of the present disclosure described with reference to FIGS. 2 and 3.

Figure 6:
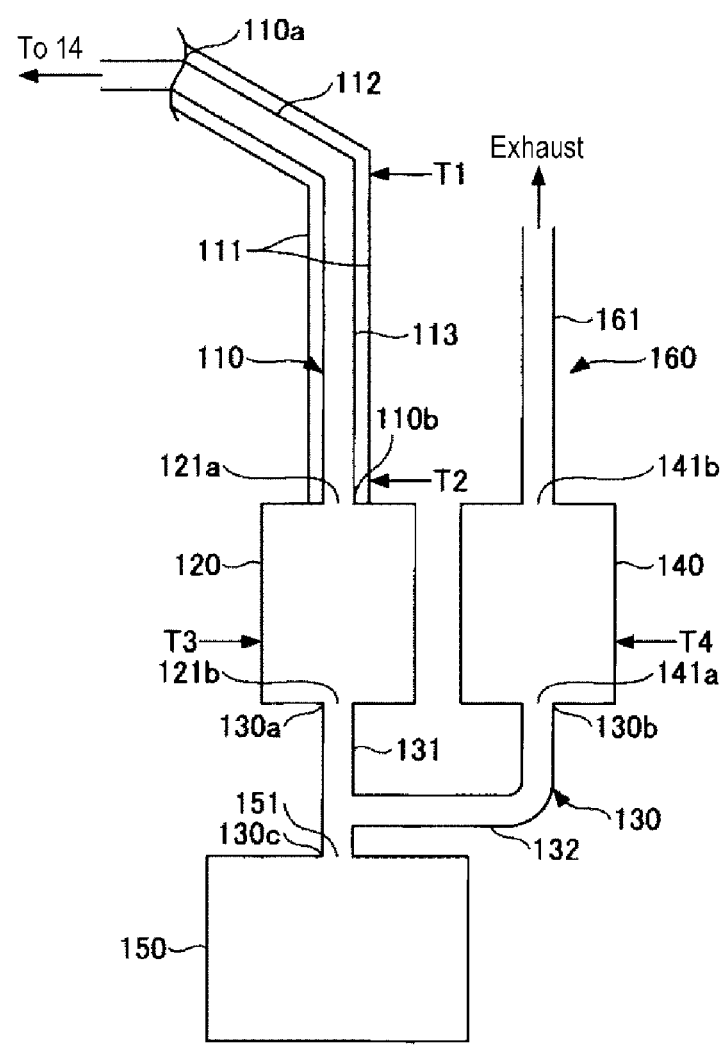
FIG. 6 is a schematic view illustrating positions of thermocouples disposed in the exhaust system according to the embodiment of the present disclosure.

FIG. 6 is a schematic view illustrating the positions of the thermocouples disposed in the exhaust system 100 according to the first example. In FIG. 6, the positions of the thermocouples are represented by T1 to T4. As shown in FIG. 6, the thermocouples were disposed at an upper end portion T1 of the vertical portion 113 of the first pipe 110, a lower end portion T2 of the vertical portion 113, the first exhaust trap 120 (T3), and the second exhaust trap 140 (T4).

In order to check cooling effects in the first exhaust trap 120 and the second exhaust trap 140 of the exhaust system 100 according to the first example, the panel heater previously set to 250 degrees C. was disposed at the outer periphery of the first pipe 110. Then, a nitrogen gas was flowed at a flow rate of 0 L/min (i.e., no gas was flowed), 31 L/min or 50 L/min in the exhaust system 100. In the first example, no cooling water was flowed in the water-cooling jacket 123.

Table 1 shows temperatures of the respective thermocouples under respective implemented conditions.

TABLE 1

| $N_2$ Flow Rate (L/min) | T1(° C.) | T2(° C.) | T3(° C.) | T4(° C.) |
|---|---|---|---|---|
| 0 | 230 | 155 | 31 | 24 |
| 31 | 189 | 178 | 57 | 50 |
| 50 | 167 | 165 | 55 | 50 |

As shown in Table 1, the temperatures of the first exhaust trap 120 and the second exhaust trap 140 are sufficiently low as compared with the temperature of the vertical portion 113 of the first pipe 110 even under any implemented conditions. Accordingly, as the exhaust system 100 according to the embodiment of the present disclosure is used, it is possible to prevent the product from being cooled in the first pipe 110 and attached to the inner wall of the first pipe 110. Further, it is possible to surely cool the product in the first exhaust trap 120 and the second exhaust trap 140, thereby guiding the product to the storage unit 150.

(Second Example)

Next, a second example will be described. In the second example, the cooling effect of the exhaust system 100 according to the embodiment of the present disclosure was confirmed by performing a simulation experiment. In the second example, simulation conditions are as follows:

Temperature of exhaust gas: 250 degrees C.;
Flow rate of exhaust gas: 50 SLM;
Exhaust pressure: atmospheric pressure to 720 Pa;
Water-cooling: existence;
Temperature of cooling jacket: 25 degrees C.; and
Setting temperature of panel heater: 250 degrees C.

Figure 7:
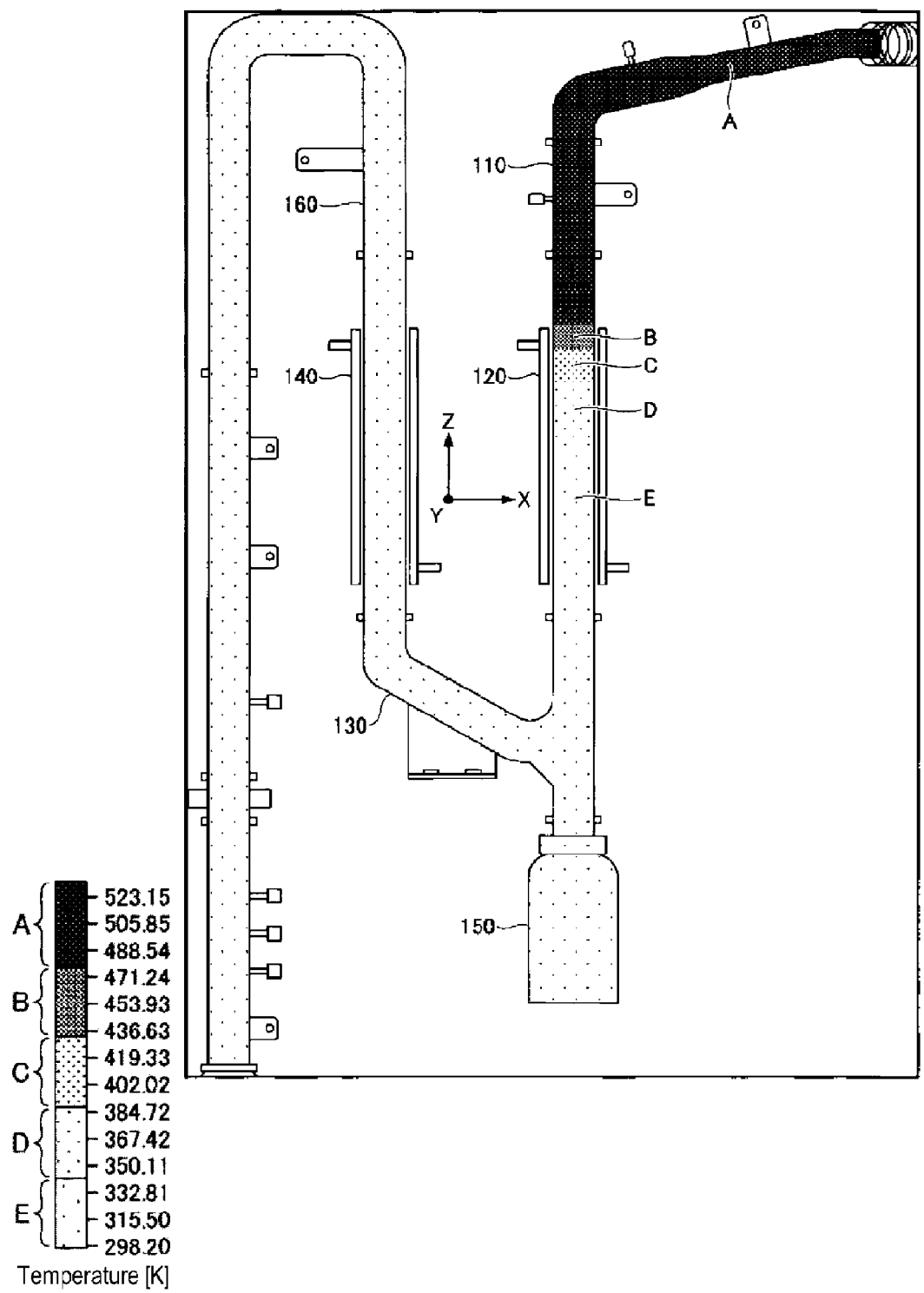
FIG. 7 is a view showing a simulation result of an exhaust system according to a second example.

FIG. 7 is a view showing a simulation result of the exhaust system 100 according to the second example. FIG. 7 shows the first pipe 110, the first exhaust trap 120, the second pipe 130, the second exhaust trap 140, the storage unit 150 and the third pipe 160. In FIG. 7, the positions of the first exhaust trap 120 and the second exhaust trap 140 are reversed as compared with those in FIGS. 2 and 4. In FIG. 7, temperature ranges are divided into A to E in order of temperature from high to show which position belongs to which temperature range.

As shown in FIG. 7, the exhaust gas at the first pipe 110 is in the highest temperature range A. As the exhaust gas enters into the first exhaust trap 120, the temperature of the exhaust gas is rapidly lowered to a temperature range E in the middle position of the first exhaust trap 120 via temperature ranges B, C and D. The other entire regions are in the temperature range E, which shows that the exhaust gas is efficiently cooled in the exhaust system 100 according to the second example.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An exhaust system connected to an exhaust port of a substrate processing apparatus, comprising:
    a first exhaust trap having an exhaust input at an upper portion of the first exhaust trap and an exhaust output at a lower portion of the first exhaust trap, and configured to cool a product produced in the substrate processing apparatus;
    a second exhaust trap installed at a downstream side of an exhaust flow with respect to the first exhaust trap and having an exhaust input at a lower portion of the second exhaust trap and an exhaust output at an upper portion of the second exhaust trap, the second exhaust trap being configured to cool the product produced in the substrate processing apparatus;
    a storage unit installed between the first exhaust trap and the second exhaust trap and storing the product cooled by the first exhaust trap and the second exhaust trap;
    a first pipe connecting the exhaust port of the substrate processing apparatus and the first exhaust trap; and
    a second pipe connecting the first exhaust trap, the second exhaust trap and the storage unit,
    wherein the second pipe extends downward from each of a third end portion connected to the first exhaust trap and a fourth end portion connected to the second exhaust trap to a fifth end portion connected to the storage unit, and
    wherein the second pipe has a vertical portion extending vertically downward from the third end portion to the fifth end portion, and a branch portion branching off from the vertical portion to extend upward from the branch portion to the fourth end portion.

2. The exhaust system of claim 1, wherein the first pipe extends downward from a first end portion connected to the exhaust port to a second end portion connected to the first exhaust trap.

3. The exhaust system of claim 2, wherein the first pipe has an inclined portion extending to be downwardly inclined from the first end portion, and a vertical portion connected to the inclined portion and extending vertically downward to the second end portion.

4. The exhaust system of claim 1, wherein each of the first exhaust trap and the second exhaust trap has a cylindrical member and a water-cooling jacket provided to cover an outer periphery of the cylindrical member.

5. The exhaust system of claim 1, wherein each of the first exhaust trap and the second exhaust trap includes a bar-shaped member installed within each of the first exhaust trap and the second exhaust trap, the bar-shaped member having a fin formed in a spiral shape along a length direction of the bar-shaped member.

6. The exhaust system of claim 1, further comprising a heating unit installed in an outer periphery of the first pipe.

7. The exhaust system of claim 1, further comprising a third pipe connected to the exhaust output of the second exhaust trap and having a vertical portion extending vertically upward from the exhaust output of the second exhaust trap.

* * * * *